(12) United States Patent
Sinoussi et al.

(10) Patent No.: US 8,810,329 B2
(45) Date of Patent: Aug. 19, 2014

(54) TEMPERATURE-STABLE LC OSCILLATORS AND METHODS OF OSCILLATION AT TEMPERATURE NULL PHASE

(76) Inventors: Nabil M. Sinoussi, Cairo (EG); Bassel Hanafi, La Jolla, CA (US)

( * ) Notice: Subject to any disclaimer, the term of this patent is extended or adjusted under 35 U.S.C. 154(b) by 99 days.

(21) Appl. No.: 13/569,649

(22) Filed: Aug. 8, 2012

(65) Prior Publication Data

US 2013/0314168 A1 Nov. 28, 2013

Related U.S. Application Data

(60) Provisional application No. 61/521,669, filed on Aug. 9, 2011.

(51) Int. Cl.
*H03B 5/08* (2006.01)
(52) U.S. Cl.
USPC ........ 331/167; 331/117 R; 331/175; 331/176; 331/182; 331/183
(58) Field of Classification Search
USPC ...... 331/117 R, 135, 167, 175, 176, 182, 183
See application file for complete search history.

(56) References Cited

U.S. PATENT DOCUMENTS

| 4,918,405 A * | 4/1990 | Herleikson | 331/11 |
| 6,606,007 B1 * | 8/2003 | Washburn | 331/116 R |
| 2010/0045394 A1 * | 2/2010 | Hanafi et al. | 331/167 |

* cited by examiner

*Primary Examiner* — Joseph Chang
*Assistant Examiner* — Jeffrey Shin
(74) *Attorney, Agent, or Firm* — Useful Arts IP (57) ABSTRACT

An LC oscillator tank that generates a tank oscillation at a phase substantially equal to a temperature null phase. The oscillator further includes frequency stabilizer circuitry coupled to the LC oscillator tank to cause the LC oscillator tank to operate at the temperature null phase. In one aspect of the disclosure, a feedback loop may split the output voltage of the LC tank into two voltages having different phases, where each voltage is independently transformed into a current through programmable transconductors, The two currents may be combined to form a resultant current which is then applied to the LC tank. The phase of the resultant current is such that the LC tank operates at an impedance condition that achieves frequency stability across temperature.

14 Claims, 6 Drawing Sheets

TEMPERATURE-STABLE LC OSCILLATORS AND METHODS OF OSCILLATION AT TEMPERATURE NULL PHASE

FIELD OF THE INVENTION

The present invention generally relates to highly stable Inductor-Capacitor (LC) oscillators which utilize the LC tank temperature null phenomenon to minimize the variations of the oscillator output frequency.

BACKGROUND OF THE INVENTION

Electronic clock generation classically relies on a reference oscillator based on an external crystal that is optionally multiplied and/or divided to generate the required clock. The key specifications of a clock, other than its target frequency, are frequency accuracy and stability. Frequency accuracy is the ability to maintain the target frequency across supply and temperature and is usually represented as drift from the target frequency in percent or parts per million (ppm). Long term stability, is impacted by the close-in phase noise of the oscillator. An oscillator using a high-Q element typically has a low phase noise profile, and thus good frequency stability, and is less sensitive to variations in oscillator amplifier gain, which is dependent on supply and temperature.

For example, crystal oscillators (XOs) are high-Q oscillators that provide excellent frequency stability and frequency accuracy across supply and temperature stemming from the very high quality factor (Q) of the crystal. However, not all resonators, including crystals, have satisfactory performance across temperature, thus the need for extra circuitry and techniques to decrease and/or compensate for shifts in frequency due to temperature. A temperature compensated crystal oscillator (TCXO) typically incorporates extra devices that have temperature dependence to negate the temperature dependence of the crystal. The overall outcome is an oscillation frequency with low temperature dependence.

However, the ever increasing complexity of electronic systems due to requirements of supporting multiple standards, increased functionality, higher data rates and increased memory in a smaller size and at a lower cost is pushing designers to increase the integration level through the development of Systems on Chip (SoC) in deep submicron Complimentary MOS (CMOS) technologies to benefit from the increased gate density. Reference clocks incorporating crystal oscillators have not managed to scale or integrate due to the bulky nature of crystals, thus limiting the size and cost reduction possible for electronic systems.

Recent efforts in using high-Q MEMS resonators and Film Bulk Acoustic Resonators (FBARs) have illustrated possibilities of integrating a high-Q element and Application Specific Integrated Circuits (ASIC) in the same package. However, packaging induced stress and its impact on performance still remains as a challenging obstacle, since the high-Q element may require special packages and/or calibration that are not practical for SoCs. The stress may change the temperature behavior of the resonator, possibly resulting in large frequency shifts and accelerated aging. Therefore, special assembly and packaging techniques are typically required to mitigate such effects, which increase the cost of producing such clocks. Similar problems may be encountered by any resonator that is dependent on the mechanical properties of the resonator material, which require careful design and manufacturing procedures and processes.

Design requirements for applications such as USB and SATA, which do not require superior frequency accuracy and stability, can be satisfied using oscillators with relatively low-Q elements available in a CMOS process which can have adequate phase noise profiles generating good jitter performance. Current trials include the use of ring oscillators, relaxation oscillators and LC oscillators. However, the reported frequency accuracy of these implementations suffers from large drift across supply and temperature, making them ineffective for applications requiring precise accuracy and stability. A mitigation to reduce the drift across temperature requires trimming across temperature which is neither cost effective nor practical for SoCs.

Therefore, an integrated solution that relies on existing optimized process steps in CMOS technology and that satisfies frequency stability and jitter requirements would be of great value. LC tank oscillators operating at the tank temperature-null phase to achieve highly stable output frequency have been described in U.S. Pat. No. 8,072,281, incorporated herein by reference. Techniques and circuits described herein include improvements and extensions that take advantage of the temperature-null phase.

DETAILED DESCRIPTION

Summary

The present invention provides a substantially temperature-independent LC-based oscillator. The oscillator includes an LC oscillator tank and frequency stabilizer circuitry coupled to the LC oscillator tank to cause the LC oscillator tank to operate at a temperature null phase generating a tank oscillation at a phase substantially equal to a temperature null phase. The temperature null phase is a phase of the LC oscillator tank at which variations in frequency of an output oscillation of the oscillator with temperature changes are reduced or minimized.

For example, the feedback loop may split the output voltage of the LC tank into two voltages having different phases, where each voltage is independently transformed into a current through programmable transconductors. The two currents may be combined to form a resultant current which is then applied to the LC tank. The phase of the resultant current is adjusted such that the LC tank operates at an impedance condition that achieves frequency stability across temperature.

The amplitude of the output voltage of the LC tank may be continuously monitored or sensed and the programmable transconductors may be adjusted substantially independently of each other. The amplitude sensing may be achieved by including an Automatic Amplitude Control (AAC) circuit in the feedback loop, in parallel with the two voltage transformation circuits.

In another aspect of the disclosure, each of the two voltages is filtered. In one aspect of the disclosure, the first voltage is low-pass filtered. In another aspect of the disclosure, the second voltage is high-pass filtered. In a further aspect of the disclosure, the path that includes the high pass filter includes a phase inversion circuit.

Description

Figure 1:
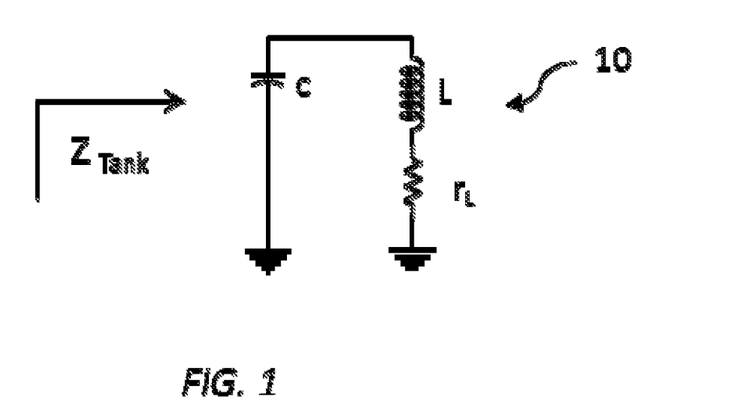
FIG. 1 is a circuit diagram illustrating an exemplary LC oscillator tank.

Referring now to FIG. 1, an LC oscillator tank circuit 10 used in building oscillators is composed of a source of inductance (inductive element) L and capacitance (capacitive element) C. The inductive element L and capacitive element C in the LC oscillator tank circuit 10 can be composed of various types of resonators and passive elements, such as but not limited to, on-chip integrated inductors, bond-wires, Metal-Insulator-Metal (MiM) Capacitors, Metal Finger Capacitors, Metal Oxide Semiconductor (MOS) capacitors, ceramic resonators, Micro Electro-Mechanical Systems (MEMS) tuning fork resonators, MEMS wine-glass resonators, MEMS-based resonators, Surface Acoustic Wave (SAW) and Bulk Acoustic Wave (BAW) devices.

The implementation of an ideal pure inductor or capacitor is usually not possible due to the physical limitations of having a finite quality factor Q. Integrated inductors in CMOS technology to date have low Q factors when compared to MEMS resonators and crystals. Sources of losses in an inductor include the inductor metal ohmic losses $r_L$ and substrate resistive losses $r_{SUB}$. Both of these losses are usually temperature dependent, and therefore, the overall impedance and Q of the inductor is temperature dependent.

The integrated capacitive part of the tank also suffers from a finite temperature dependent Q as well as temperature dependence of the capacitance value. As a result, the physical implementation of an integrated LC-tank will dictate a strong temperature dependence of the impedance and Q factor of the tank, which results in a temperature dependent tank resonance frequency.

An oscillator built using an LC oscillator tank 10 typically includes an amplifier responsible for overcoming the tank losses. For the oscillator to have sustained oscillations, the Barkhausen criterion requires an open loop gain greater than 1 and phase equal to zero. Assuming that the amplifier contributes a zero phase, then for oscillation to occur, the LC oscillator tank impedance $Z_{Tank}$ must have a zero phase. The phase condition is used to derive the oscillation frequency $\omega_{osc}$ as follows:

$$Z_{Tank} = \frac{r_L + j\omega L}{1 + j\omega r_L C - \omega^2 LC}$$ Equation 1

$$\varphi_{Tank} = \tan^{-1}\frac{\omega L}{r_L} - \tan^{-1}\frac{\omega r_L C}{1 - \omega^2 LC}$$ Equation 2

An oscillation condition of $\phi_{Tank}=0$ results in:

$$\omega_{osc} = \omega_o \sqrt{1 - \frac{r_L^2 C}{L}},$$ Equation 3 where $$\omega_o = \frac{1}{\sqrt{LC}}$$

From the above equations 1-3, it can be seen that the oscillation frequency is temperature dependent if $r_L$ is temperature dependent. A linear variation of $r_L$ with temperature results in an almost linear variation of the oscillation frequency. In addition, any temperature variation in C would strongly contribute to the temperature dependence.

Figure 2:
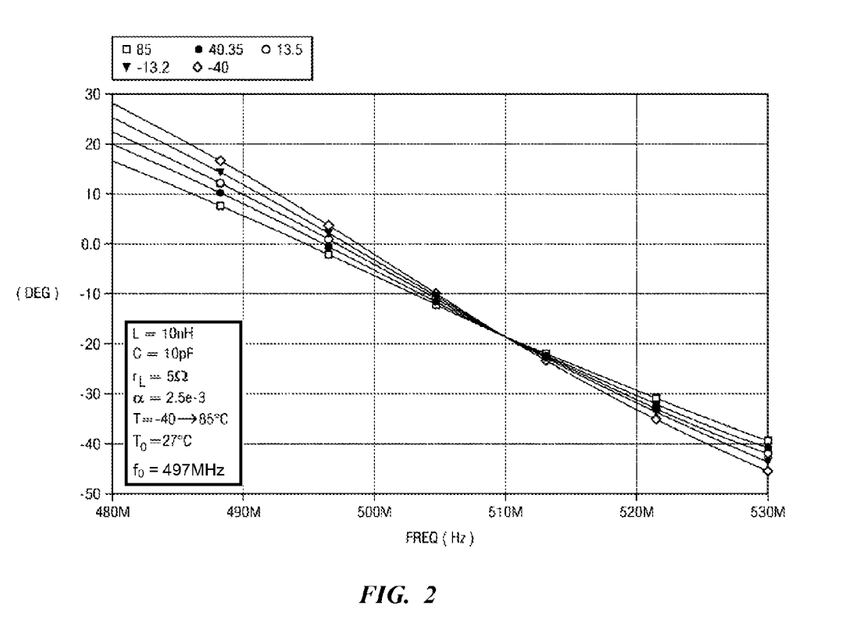
FIG. 2 illustrates phase plots of an exemplary LC oscillator tank.

This is graphically shown in FIG. 2, where $\phi_{Tank}$ is plotted for different temperatures for a tank composed of L, $r_L$ and C with linear temperature dependence of $r_L$ defined as:

$$r_L = r_o(1+\alpha(T-T_0))$$ Equation 4 where $\alpha$ is a temperature coefficient of $r_L$.

Figure 3:
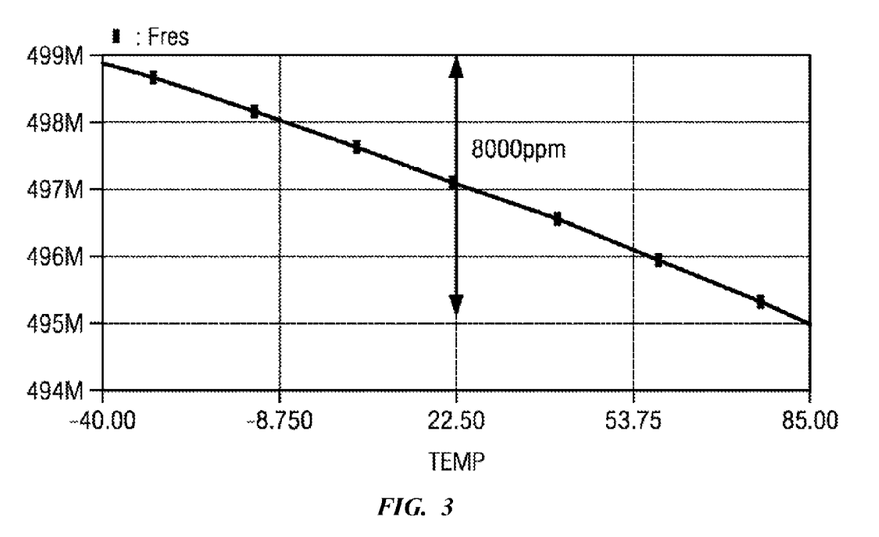
FIG. 3 illustrates the oscillation frequency across temperature of an LC oscillator tank operating at zero phase.

It is to be noted that the oscillation frequency is determined using the intersection of $\phi_{Tank}=0$ with the phase plots. The corresponding oscillation frequency across temperature is plotted in FIG. 3, showing a strong temperature dependence of 8000 ppm in a typical LC oscillator tank operating at zero phase.

Examining the phase plots again in FIG. 2, since the quality factor of the tank changes with temperature, the phase plots change with temperature. In addition, at the oscillation frequency, there is a higher Q at lower temperatures, and therefore, a larger negative slope is seen at lower temperatures. Therefore, the varying phase plot slopes with temperature result in the intersection of these plots.

When the intersections occur at the same phase, a temperature insensitive tank operating point is created, and the tank is said to be operating at a temperature "null" with a phase $\phi_{Null}$. The ideal temperature null phase occurs when the phase plots across temperature intersect at precisely the same phase. Oscillation with a phase across the tank ideally equal to $\phi_{Null}$ results in an oscillation frequency with zero deviation across temperature.

Figure 4:
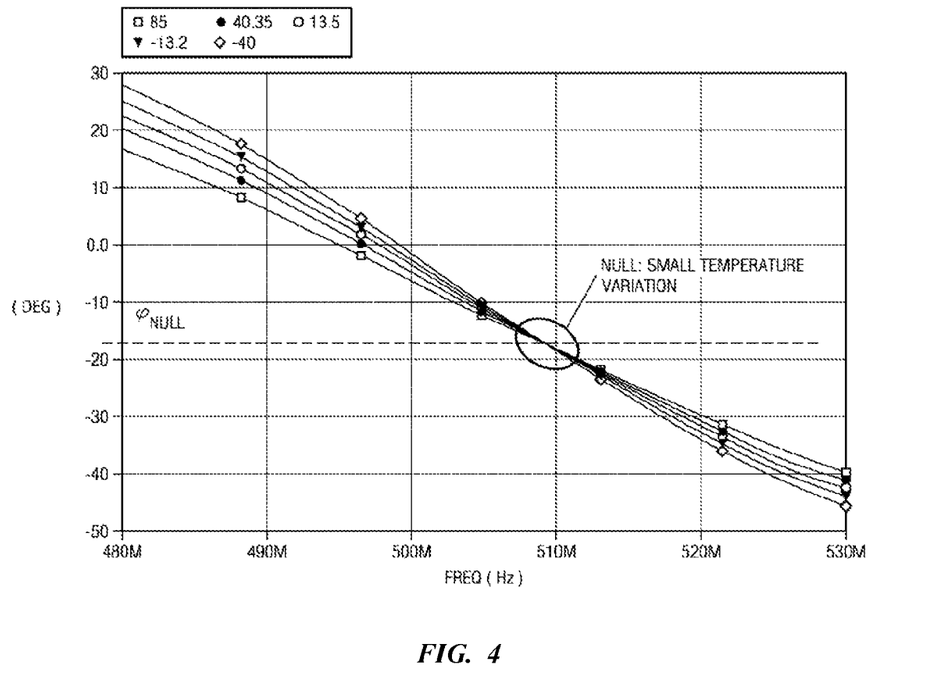
FIG. 4 illustrates a temperature null phase of an exemplary LC oscillator tank.
Figure 5:
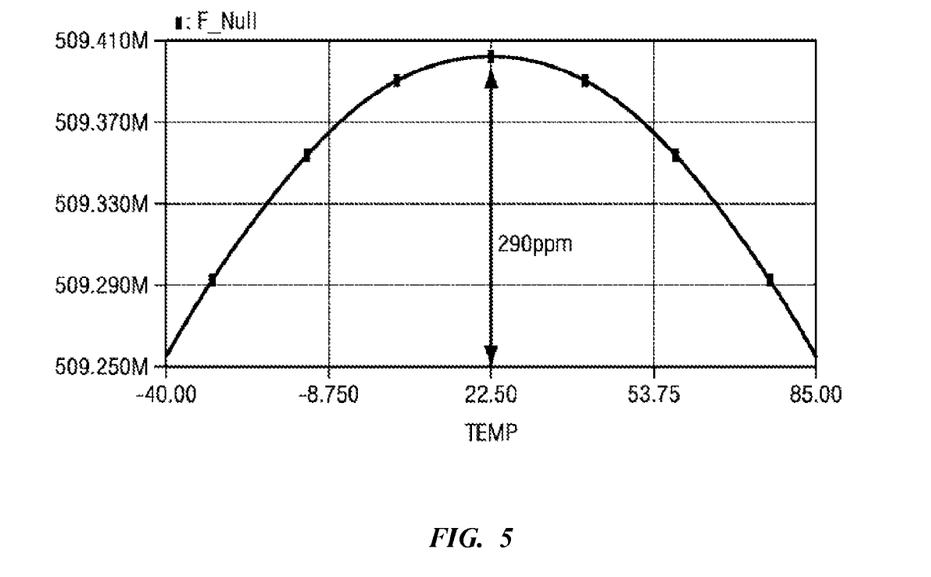
FIG. 5 illustrates frequency deviation across temperature while operating at the temperature null phase.

More realistic tanks exhibit a temperature null with small frequency deviations across temperature. This is illustrated graphically in FIG. 4, where the condition of oscillation is $\phi_{Tank}=\phi_{Null}$ and the corresponding oscillation frequency across temperature is plotted. As can be seen in FIG. 5, operating the oscillator at the temperature null phase results in an oscillation frequency with a much lower temperature dependence. For example, in FIG. 5, the frequency drift is only 290 ppm. Comparing this to the 8000 ppm frequency drift at zero phase in FIG. 3, oscillating at the temperature null phase produces a more stable frequency.

A Global Temperature Null (GNull) can be defined as a phase operating point $\phi_{GNull}$ that results in a minimum frequency deviation f across a temperature range T with a very small or zero change in oscillation frequency over temperature $$\frac{d_{f_{osc}}}{dT}$$

at the center of the temperature range $T_0$. A measure of the quality of the temperature null is the oscillation frequency deviation across temperature. A Figure of Merit (FOM) of the tank temperature null may be defined as:

$$FOM = \frac{\Delta f}{f_{T0}\Delta T} ppm/^\circ C. \qquad \text{Equation 5}$$

where $f_{T0}$ is the oscillation frequency at $T_0$. The smaller the value of the FOM, the better the null quality is with the perfect null occurring at FOM=0.

A Local Temperature Null (LNull) can be defined as a phase operating point $\phi_{LNull}$ with $$\frac{df_{osc}}{dT} = 0.$$

Alternatively, LNull can be defined at temperature T as the intersection of the phase plots of temperatures (T+δ) and (T−δ) where δ is infinitesimally small.

The GNull oscillation frequency $\omega_{GNull}$ around temperature $T_0$ may be derived by finding the intersection of two phase curves at temperatures $T_0+\Delta T$ and $T_0-\Delta T$. For an LC oscillator tank with a linear temperature dependence of $r_L$ the phase and frequency at the GNull are as follows:

$$\omega_{GNull} = \omega_0 \sqrt{1 + \frac{C}{L}r_0^2(1 - \alpha^2 \Delta T^2)} \qquad \text{Equation 6}$$

and:

$$\phi_{GNull} = -\tan^{-1}(2r_0 C \omega_{GNull}) \qquad \text{Equation 7}$$

Figure 6:
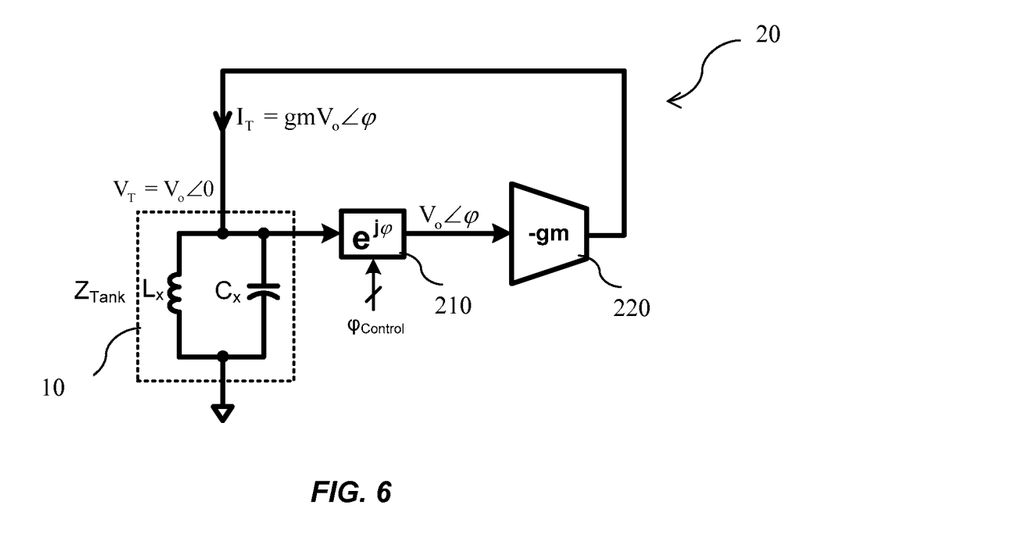
FIG. 6 illustrates an oscillator operating at tank temperature-null phase.

In order to force the tank to oscillate at a non-zero phase while satisfying the Barkhausen criterion, the active circuitry associated with the tank must provide the same phase as the tank but with an opposite sign. In other words, if the tank phase is −φ, then the active circuitry must provide a phase φ. One aspect of the disclosure of a temperature-stable oscillator is shown in FIG. 6. Here the tank 10 operates at a of phase −φ while the overall circuit 20 satisfies the Barkhausen criterion. The tank voltage $V_T$ is applied to a phase shifter block 210 which adds a phase shift φ to $V_T$ such that the input voltage to the transconductor 220 is $V_0 < \phi$. Therefore, the transconductor 220 generates the tank current ($I_T$) shifted by a phase φ referred to the tank voltage ($V_T$) under the assumption that the transconductor introduces a substantially small phase shift. Hence, for the Barkhausen criterion to be satisfied in this loop, the tank impedance is given by:

$$Z_{Tank} = \frac{V_T}{I_T} = \frac{1}{g_m}e^{-j\varphi} \qquad \text{Equation 8}$$

In another aspect of the disclosure, the phase φ introduced by the phase shifter block 210 is programmed by the digital word $\phi_{Control}$ so as to be as close as possible to the tank temperature null phase $\phi_{GNULL}$.

Figure 7A:
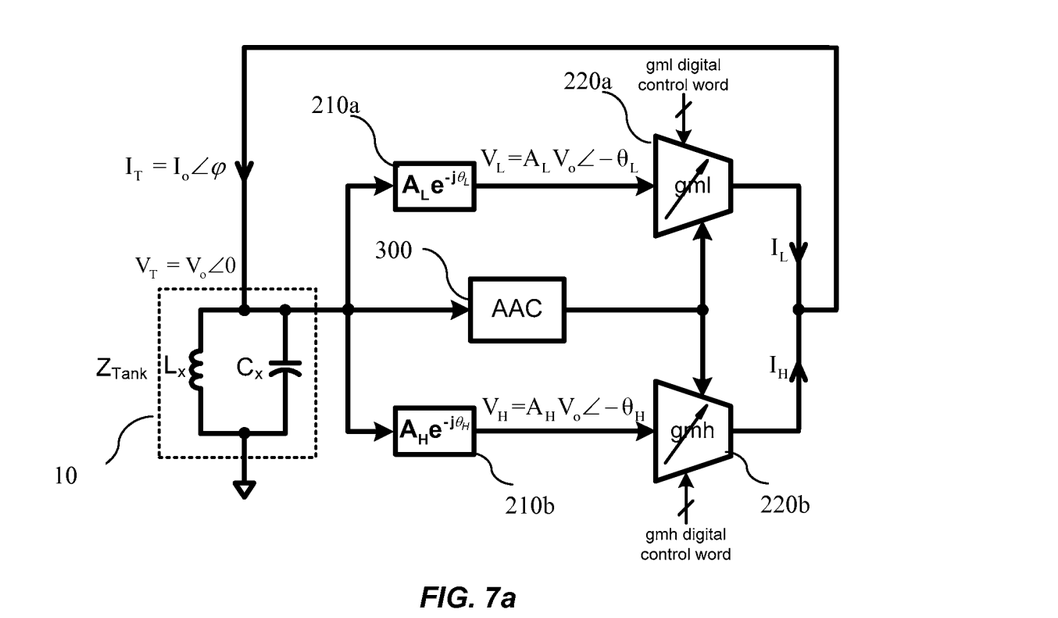
FIG. 7A illustrates another oscillator operating at tank temperature-null phase.

Another aspect of the disclosure is shown in FIG. 7A where another circuit technique to operate at the tank temperature-null phase is described. The tank AC (Alternating Current) voltage signal $V_T$ is split into two paths. The first path is through a phase shifter 210a and provides an AC voltage signal $V_L$. Referred to the tank voltage $V_T$, the phase of $V_L$ is shifted by $-\theta_L$ and the amplitude of $V_L$ is scaled by $A_L$. $V_L$ is then used as an input to the programmable transconductor 220a to produce the current $I_L$. The second path is through a phase shifter 210b and provides an AC voltage signal $V_H$. Referred to the tank voltage $V_T$, the phase of the signal $V_H$ is shifted by $-\theta_H$ and the amplitude of $V_H$ is scaled by $A_H$. $V_H$ is then used as an input to the programmable transconductor 220b to produce the current $I_H$. The output currents from both paths $I_L$ and $I_H$ are summed up to generate the total tank current $I_T$. Finally, the AAC block 300 adjusts the oscillator amplitude level such that the oscillator operates at the critical oscillation condition and the transconductors 220a and 220b operate in their linear regime. This minimizes the oscillation signal harmonic content and the impact of this content on frequency stability.

Figure 7B:
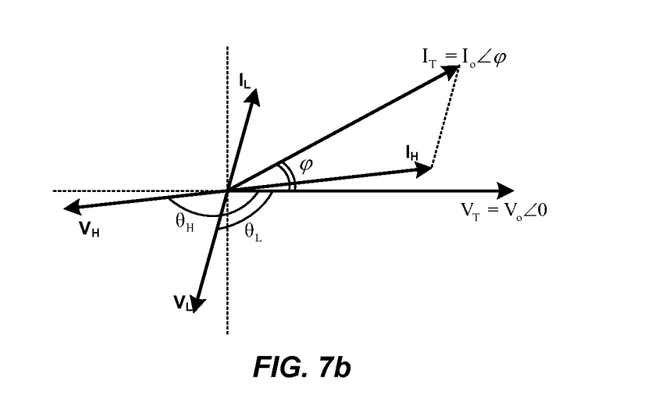
FIG. 7B illustrates a phasor diagram for the signals of the circuit of FIG. 7A.

In order to understand how the temperature-null phase $\phi_{GNULL}$ is obtained from the apparatus in FIG. 7A, one has to track the phase and amplitude of the voltage and current signals denoted on the figure. FIG. 7B shows a phasor diagram of the voltage and current signals present in FIG. 7a. The phasors in FIG. 7B are expressed by the following equations:

$$V_T = V_o < 0 \qquad \text{Equation 7A}$$

$$V_H = A_H V_o < -\theta_H \qquad \text{Equation 7B}$$

$$V_L = A_L V_o < -\theta_L \qquad \text{Equation 7C}$$

$$I_H = -gmh A_H V_o < -\theta_H \qquad \text{Equation 7D}$$

$$I_L = -gml A_L V_o < -\theta_L \qquad \text{Equation 7E}$$

$$I_T = I_o < \phi \qquad \text{Equation 7F}$$

By direct derivation, the phase shift φ across the tank impedance ($Z_{Tank}$) between $I_T$ and $V_T$ is given by:

$$\varphi = 180 - \tan^{-1}\left(\frac{\sin(\theta_H) + \left(\frac{A_L gml}{A_H gmh}\right)\sin(\theta_L)}{\cos(\theta_H) + \left(\frac{A_L gml}{A_H gmh}\right)\cos(\theta_L)}\right) \qquad \text{Equation 8}$$

Hence, the phase $\phi_{GNULL}$ can be obtained accurately by adjusting the ratio between the two programmable transconductors 220a and 220b through the digital control words denoted in FIG. 7A. In one embodiment, the phase shifts $\theta_H$ and $\theta_L$ and the amplitude scaling factors $A_H$ and $A_L$ provided by the two phase shifters should be substantially constant with temperature; otherwise, the frequency stability at the temperature-null is affected by their temperature dependence.

Figure 8A:
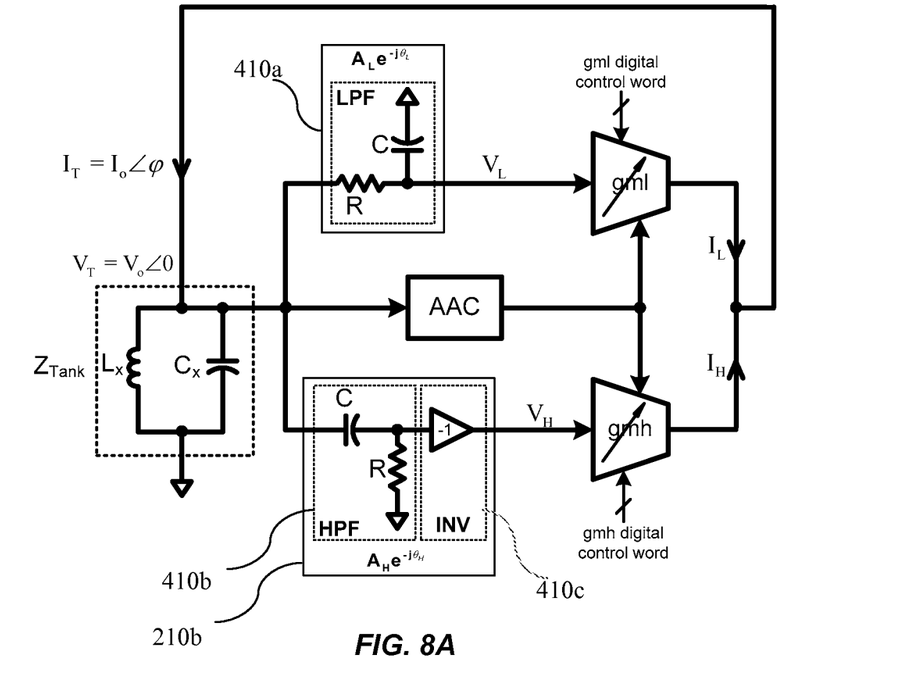
FIG. 8A is a diagram of an oscillator including a tank operating at temperature-null phase using first order low-pass and high-pass filters.
Figure 8B:
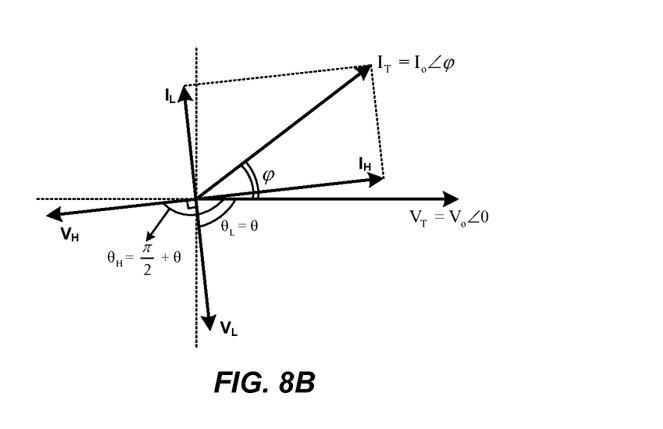
FIG. 8B is a phasor diagram for the signals in the apparatus of FIG. 8A

In another aspect of the disclosure the phase shifter 210a of FIG. 7A is realized by a first order low-pass filter (LPF) as shown in FIG. 8A in block 410a. The LPF consists of a resistance "R" and a capacitance "C". In yet another aspect of the disclosure, the phase shifter 210b of FIG. 7A is realized by a first order high-pass filter (HPF) 410b and an inverting stage as block 410c as shown in FIG. 8A. The HPF 410b consists of a capacitance "C" and a resistance "R". The inverter 410c provides a 180° phase shift to the signal. The values of both R and C of the HPF substantially match those of the LPF. FIG. 8B shows a phasor diagram of the voltage and current signals present in FIG. 8a.

As described in M. E. Van Valkenburg, "Analog Filter Design," (Oxford University Press, 1995) in reference to FIG. 8A, $A_L$, $\theta_L$, $A_H$ and $\theta_H$ are expressed by the following equations:

$$A_L = \frac{1}{\sqrt{1+(\omega RC)^2}} \qquad \text{Equation 9A}$$

$$\theta_L = \theta = \tan^{-1}(\omega RC) \qquad \text{Equation 9B}$$

$$A_H = \frac{\omega RC}{\sqrt{1+(\omega RC)^2}} \qquad \text{Equation 9C}$$

$$\theta_H = \frac{\pi}{2} + \theta \qquad \text{Equation 9D}$$

Here R and C are the resistance and the capacitance, respectively, used in both the LPF and HPF. Furthermore, $\omega$ is the angular frequency at which the LPF and HPF are operating. For the specific case of the oscillator, $\omega$ is the oscillation frequency.

FIG. 8A. The phasors in FIG. 8A are expressed by the following relations:

$$V_T = V_o \angle 0 \qquad \text{Equation 10A}$$

$$V_H = \frac{V_o \omega RC}{\sqrt{1+(\omega RC)^2}} \angle -\left(\frac{\pi}{2}+\theta\right) \qquad \text{Equation 10B}$$

$$V_L = \frac{V_o}{\sqrt{1+(\omega RC)^2}} \angle -\theta \qquad \text{Equation 10C}$$

$$I_H = gmh V_o \frac{\omega RC}{\sqrt{1+(\omega RC)^2}} \angle \left(\frac{\pi}{2}-\theta\right) \qquad \text{Equation 10D}$$

$$I_L = \frac{gml V_o}{\sqrt{1+(\omega RC)^2}} \angle (\pi-\theta) \qquad \text{Equation 10E}$$

$$I_T = I_o \angle \varphi \qquad \text{Equation 10F}$$

Finally, the phase shift $\phi$ across the tank impedance ($Z_{Tank}$) between $I_T$ and $V_T$ is given by:

$$\varphi = 180 - \theta - \tan^{-1}\left(\omega RC \frac{gmh}{gml}\right) \qquad \text{Equation 11}$$

Hence, the phase $\phi_{GNULL}$ can be obtained accurately by adjusting the ratio between the two programmable transconductors gml and gmh through the digital control words denoted in FIG. 8A.

The product of R times C or the time constant RC must be substantially constant with temperature; otherwise, the frequency stability at the temperature-null phase is affected by temperature dependence of the RC time constant. Stabilizing the time constant RC versus temperature can be done using different techniques. A first example technique is obtaining R and C such that each of them is substantially stable versus temperature. A second example technique is to obtain R whose temperature dependence is substantially opposite to that of C and hence obtain a substantially stable product RC time constant.

As will be recognized by those skilled in the art, the innovative concepts described in the present application can be modified and varied over a wide range of applications. Accordingly, the scope of patents subject matter should not be limited to any of the specific exemplary teachings discussed, but is instead defined by the following claims.

What is claimed is:

1. A method of operating a feedback oscillator circuit comprising an LC tank and an amplifier circuit coupled in a closed loop, the feedback oscillator circuit producing an output signal having a frequency of oscillation, the method comprising:
    applying a first phase shift and a second phase shift to an output voltage of the LC tank to split the output voltage into a first voltage and a second voltage having different phases;
    converting the first voltage into a first current in accordance with a first programmable transconductance value;
    converting the second voltage into a second current in accordance with a second programmable transconductance value;
    combining the first and second currents to obtain a resultant current; and
    applying the resultant current to the LC tank.

2. The method of claim 1, wherein the resultant current sets the LC tank to operate at an impedance condition chosen in order to stabilize the frequency across temperature, the impedance condition having an associated non-zero impedance angle.

3. The method of claim 2, wherein the different phases of the first and second voltages cause an oscillation condition to be satisfied by producing a non-zero phase shift within the closed loop, the phase shift having an opposite sign to a sign of an LC tank impedance angle.

4. The method of claim 1, comprising:
    sensing an amplitude of the output voltage of the LC tank; and
    adjusting the first transconductance value and the second transconductance value to maintain linear operation of the amplifier circuit.

5. The method of claim 1, wherein the first phase shift is obtained by performing low-pass filtering.

6. The method of claim 1, wherein the second phase shift is obtained by performing high-pass filtering followed by a phase inversion.

7. A feedback oscillator circuit producing an output signal having a frequency of oscillation, comprising:
    an LC tank;
    circuitry for splitting an output voltage of the LC tank into a first voltage and a second voltage having different phases;
    an amplifier circuit coupled in a closed loop with the LC tank, comprising:
        circuitry for converting the first voltage into a first current in accordance with a first programmable transconductance value; and
        circuitry for converting the second voltage into a second current in accordance with a second programmable transconductance value; and
    circuitry for combining the first and second currents to obtain a resultant current, and applying the resultant current to the LC tank.

8. The apparatus of claim 7, wherein the resultant current sets the LC tank to operate at an impedance condition chosen in order to stabilize the frequency across temperature, the impedance condition having an associated non-zero impedance angle.

9. The apparatus of claim 8, wherein the different phases of the first and second voltages cause an oscillation condition to be satisfied by producing a non-zero phase shift within the closed loop, the phase shift having an opposite sign to a sign of an LC tank impedance angle.

10. The apparatus of claim 7, comprising an automatic amplitude controller coupled to the LC tank for sensing an amplitude of the output voltage of the LC tank and adjusting the first transconductance value and the second transconductance value to maintain linear operation of the amplifier circuit.

11. The apparatus of claim 7, wherein the circuitry for splitting comprises a first phase shifter circuit coupled to the LC tank, wherein the first voltage is derived from an output signal of the first phase shifter circuit.

12. The apparatus of claim 11, wherein the first phase shifter circuit comprises a low-pass filter.

13. The apparatus of claim 11, wherein the circuitry for splitting comprises a second phase shifter circuit coupled to the LC tank, wherein the second voltage is derived from an output signal of the second phase shifter circuit.

14. The apparatus of claim 13, wherein the second phase shifter circuit comprises a high-pass filter followed by a phase inverter.

* * * * *